(12) United States Patent
Chow et al.

(10) Patent No.: US 12,706,281 B2
(45) Date of Patent: Aug. 11, 2026

(54) EROSION RATE MONITORING FOR WAFER FABRICATION EQUIPMENT

(71) Applicant: Micron Technology, Inc., Boise, ID (US)

(72) Inventors: Synn Nee Chow, Singapore (SG); Robert Brian Skaggs, Kuna, ID (US); Chao Lin Lee, Singapore (SG); Alex James Schrinsky, Boise, ID (US)

(73) Assignee: Micron Technology, Inc., Boise, ID (US)

(*) Notice: Subject to any disclaimer, the term of this patent is extended or adjusted under 35 U.S.C. 154(b) by 469 days.

(21) Appl. No.: 17/872,835

(22) Filed: Jul. 25, 2022

(65) Prior Publication Data

US 2024/0030006 A1 Jan. 25, 2024

(51) Int. Cl.
*H01J 37/32* (2006.01)
*H01J 37/34* (2006.01)

(52) U.S. Cl.
CPC .. *H01J 37/32642* (2013.01); *H01J 37/32715* (2013.01); *H01J 37/347* (2013.01)

(58) Field of Classification Search
CPC .............. H01J 37/347; H01J 37/32642; H01L 21/68735; H01L 2224/49052; H01L 2224/3303; H01L 21/68742; H01L 21/68721; H01L 21/68714; H01L 21/68707; H01L 21/687; H01L 21/68728; H01L 2023/4087; H01L 21/67288
USPC .............................................................. 73/86
See application file for complete search history.

(56) References Cited

U.S. PATENT DOCUMENTS

| | | | | |
|---|---|---|---|---|
| 10,083,852 | B1 * | 9/2018 | Balan | H01L 21/68757 |
| 2021/0118685 | A1 * | 4/2021 | Ko | H01L 21/3065 |
| 2022/0146258 | A1 * | 5/2022 | Sadeghi | H01J 37/3299 |
| 2022/0270901 | A1 * | 8/2022 | Sadeghi | G05B 19/41875 |
| 2023/0369026 | A1 * | 11/2023 | Kimball | H01L 21/68735 |

FOREIGN PATENT DOCUMENTS

| | | | | |
|---|---|---|---|---|
| CN | 112701027 A * | 4/2021 | | H01J 37/32431 |
| KR | 20210002175 A * | 1/2021 | | |
| WO | WO-2020219138 A1 * | 10/2020 | | H01J 37/32477 |

* cited by examiner

*Primary Examiner* — John E Breene
*Assistant Examiner* — Truong D Phan
(74) *Attorney, Agent, or Firm* — Holland & Hart LLP

(57) ABSTRACT

Methods, systems, and apparatuses for erosion rate monitoring for wafer fabrication equipment are described to support determining a real-time edge ring erosion rate for an edge ring used in manufacturing memory devices or other semiconductor devices. A manufacturing system may support a real-time edge ring erosion rate determination using force sensors, which may measure the weight of the edge ring. The controller may correlate the measured weight to a height of the edge ring. The controller may use the height to adjust a vertical placement of the edge ring, or one or more other manufacturing variables, during manufacturing operations, which may compensate for edge ring erosion and reduce or eliminate yield loss when manufacturing a memory device or other semiconductor device.

25 Claims, 7 Drawing Sheets

200

500

600

EROSION RATE MONITORING FOR WAFER FABRICATION EQUIPMENT

FIELD OF TECHNOLOGY

The following relates to one or more systems for memory, including erosion rate monitoring for wafer fabrication equipment.

BACKGROUND

Memory devices are widely used to store information in various electronic devices such as computers, user devices, wireless communication devices, cameras, digital displays, and the like. Information is stored by programming memory cells within a memory device to various states. To access the stored information, a component may read (e.g., sense, detect, retrieve, identify, determine, evaluate) a stored state in the memory device. To store information, a component may write (e.g., program, set, assign) the state in the memory device.

Memory devices may be fabricated using manufacturing equipment (e.g., wafer manufacturing equipment) that may perform one or more techniques on materials supported by a substrate of a memory device. For example, manufacturing equipment may fabricate a memory device based on adding material to the memory device (e.g., above the substrate, one or more materials supported by the substrate), remove material from the memory device (e.g., above the substrate, one or more materials supported by the substrate), or both. Such techniques may vary among different types of memory devices, different manufacturing processes, different manufacturing equipment, or different manufacturing locations, among other examples, and may be performed by the manufacturing equipment in a defined order to result in fabrication of a corresponding memory device. As technical complexity, or advancement, of a memory device increases, techniques for fabricating the memory device (e.g., a quantity of manufacturing processes, a type or technique associated with manufacturing processes) may also become more complex (e.g., increase in quantity, sensitivity).

DETAILED DESCRIPTION

Figure 1:
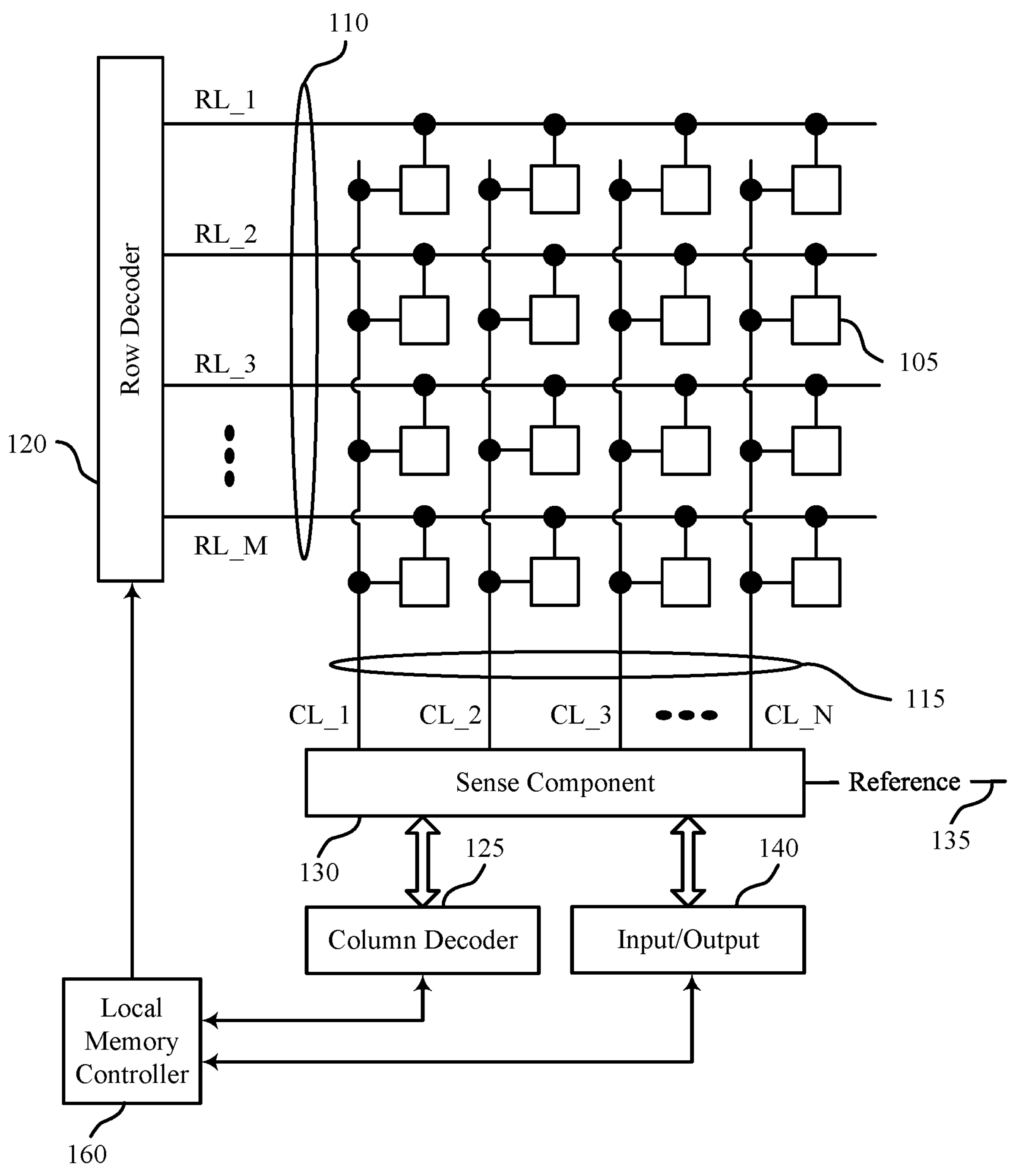
FIG. 1 illustrates an example of a memory die that supports erosion rate monitoring for wafer fabrication equipment in accordance with examples as disclosed herein.

In some manufacturing methods, an etching process (e.g., a plasma etching process) may perform various treatments on a substrate or other portions of a wafer (e.g., a wafer for a memory device). An edge ring positioned radially and adjacent to the wafer may be utilized to adjust the effect of the plasma on the substrate, such as by holding an ion sheath or by performing one or more other functions. Due to one or more processing techniques performed over time, the edge ring may erode over multiple uses (e.g., may erode in a vertical direction, may lose height or become shorter). The edge ring erosion may further result in bending of the ion sheath, among other undesirable results, which may cause loss of functionality or removal of an outer portion of the wafer during processing (e.g., may cause yield loss). Some techniques for measuring edge ring erosion, may result in inaccurate calculations of erosion because edge ring erosion may occur in a non-linear fashion, and may additionally or alternatively occur at different rates for different manufacturing processes. Additionally, some erosion monitoring techniques may also result in inaccurate calculations, or may be unable to be implemented, because of space constraints within a manufacturing chamber, or due to potential contamination.

According to the techniques described herein, a real-time edge ring erosion rate measurement technology may be utilized to correct ion sheath bending and other problems associated with edge loss when manufacturing a memory wafer. For example, a substrate support system may include a substrate support, a ring (e.g. edge ring), and a ring support structure that may be equipped with one or more sensors to measure a weight associated with the ring. The various sensors, for example, may measure the weight of the ring, which may be converted into a ring height by a controller and utilized to set an offset for a position of the ring to account for ring erosion when performing one or more manufacturing procedures. For example, the controller may determine whether to vertically reposition the ring relative to the substrate (e.g., wafer) and corresponding substrate support, based on the calculated offset. The controller may reposition the ring via actuators and associated pins to bring the ring to a desired height (relative to the substrate, wafer) for a respective manufacturing operation, which may reduce or eliminate yield loss during wafer manufacturing (e.g., yield loss associated with edge ring erosion and incorrect edge ring placement).

Features of the disclosure are initially described in the context of dies and manufacturing systems as described with reference to FIGS. 1 and 2. Features of the disclosure are described in the context of a manufacturing system, a flowchart, and a system as described with reference to FIGS. 3A through 5. These and other features of the disclosure are further illustrated by and described with reference to an apparatus diagram and flowcharts that relate to erosion rate monitoring for wafer fabrication equipment as described with reference to FIGS. 6 and 7.

FIG. 1 illustrates an example of a memory die 100 that supports erosion rate monitoring for wafer fabrication equipment in accordance with examples as disclosed herein. In some examples, the memory die 100 may be referred to as a memory chip, a memory device, or an electronic memory apparatus. The memory die 100 may include one or more memory cells 105 that may be programmable to store different logic states (e.g., programmed to one of a set of two or more possible states). For example, a memory cell 105 may be operable to store one bit of information at a time (e.g., a logic 0 or a logic 1). In some examples, a memory cell 105 (e.g., a multi-level memory cell) may be operable to store more than one bit of information at a time (e.g., a logic 00, logic 01, logic 10, a logic 11).

FIG. 1 illustrates a memory device (e.g., at least a portion thereof, such as a memory die 100) that may be manufactured using techniques described in accordance with one or more aspects of the present disclosure. These techniques may be applied to any memory device, including but not limited to, the memory device as illustrated by FIG. 1. For example, some general memory device characteristics are illustrated by FIG. 1 and described with reference to FIG. 1, but the techniques described herein may apply generally to any memory device, as may be appreciated by one of skill in the art.

In some examples, a memory cell 105 may store a charge representative of the programmable states in a capacitor. Some memory device architectures may include a capacitor that includes a dielectric material to store a charge representative of the programmable state. In other memory architectures, other storage devices and components are possible. For example, NAND memory storage, ferroelectric materials, nonlinear dielectric materials, or phase change memory materials may be employed, among other examples. The memory cell 105 may include a logic storage component, such as capacitor 130 (e.g., among other examples described herein), and a switching component (e.g., a cell selection component). The capacitor 130 may be an example of a dielectric capacitor or a ferroelectric capacitor. A node of the capacitor 130 may be coupled with a voltage source, which may be the cell plate reference voltage, such as Vpl, or may be ground, such as Vss.

The memory die 100 may include access lines (e.g., word lines 110, digit lines 115) arranged in a pattern, such as a grid-like pattern. An access line may be a conductive line coupled with a memory cell 105 and may be used to perform access operations on the memory cell 105. In some examples, word lines 110 may be referred to as row lines. In some examples, digit lines 115 may be referred to as column lines or bit lines. References to access lines, row lines, column lines, word lines, digit lines, or bit lines, or their analogues, are interchangeable without loss of understanding. Memory cells 105 may be positioned at intersections of the word lines 110 and the digit lines 115.

Operations such as reading and writing may be performed on the memory cells 105 by activating access lines such as a word line 110 or a digit line 115. By biasing a word line 110 and a digit line 115 (e.g., applying a voltage to the word line 110 or the digit line 115), a single memory cell 105 may be accessed at their intersection. The intersection of a word line 110 and a digit line 115 in a two-dimensional or in a three-dimensional configuration may be referred to as an address of a memory cell 105. Activating a word line 110 or a digit line 115 may include applying a voltage to the respective line.

Accessing the memory cells 105 may be controlled through a row decoder 120, or a column decoder 125, or any combination thereof. For example, a row decoder 120 may receive a row address from the local memory controller 160 and activate a word line 110 based on the received row address. A column decoder 125 may receive a column address from the local memory controller 160 and may activate a digit line 115 based on the received column address.

Selecting or deselecting the memory cell 105 may be accomplished by activating or deactivating the switching component using a word line 110. The capacitor 130 may be coupled with the digit line 115 using the switching component. For example, the capacitor 130 may be isolated from digit line 115 when the switching component is deactivated, and the capacitor 130 may be coupled with digit line 115 when the switching component is activated.

The sense component may be operable to detect a state (e.g., a charge) stored on the capacitor 130 of the memory cell 105 and determine a logic state of the memory cell 105 based on the stored state. The sense component may include one or more sense amplifiers to amplify or otherwise convert a signal resulting from accessing the memory cell 105. The sense component may compare a signal detected from the memory cell 105 to a reference 135 (e.g., a reference voltage). The detected logic state of the memory cell 105 may be provided as an output of the sense component (e.g., to an input/output 140), and may indicate the detected logic state to another component of a memory device that includes the memory die 100.

The local memory controller 160 may control the accessing of memory cells 105 through the various components (e.g., row decoder 120, column decoder 125, sense component). In some examples, one or more of the row decoder 120, column decoder 125, and sense component may be co-located with the local memory controller 160. The local memory controller 160 may be operable to receive one or more of commands or data from one or more different memory controllers, translate the commands or the data (or both) into information that can be used by the memory die 100, perform one or more operations on the memory die 100, and communicate data from the memory die 200 to a host based on performing the one or more operations. The local memory controller 160 may generate row signals and column address signals to activate the target word line 110 and the target digit line 115. The local memory controller 160 also may generate and control various signals (e.g., voltages, currents) used during the operation of the memory die 100. In general, the amplitude, the shape, or the duration of an applied voltage or current discussed herein may be varied and may be different for the various operations discussed in operating the memory die 100.

The local memory controller 160 may be operable to perform one or more access operations on one or more memory cells 105 of the memory die 100. Examples of access operations may include a write operation, a read operation, a refresh operation, a precharge operation, or an activate operation, among others. In some examples, access operations may be performed by or otherwise coordinated by the local memory controller 160 in response to various access commands from a host device. The local memory controller 160 may be operable to perform other access operations not listed here or other operations related to the operating of the memory die 100 that are not directly related to accessing the memory cells 105.

Figure 2:
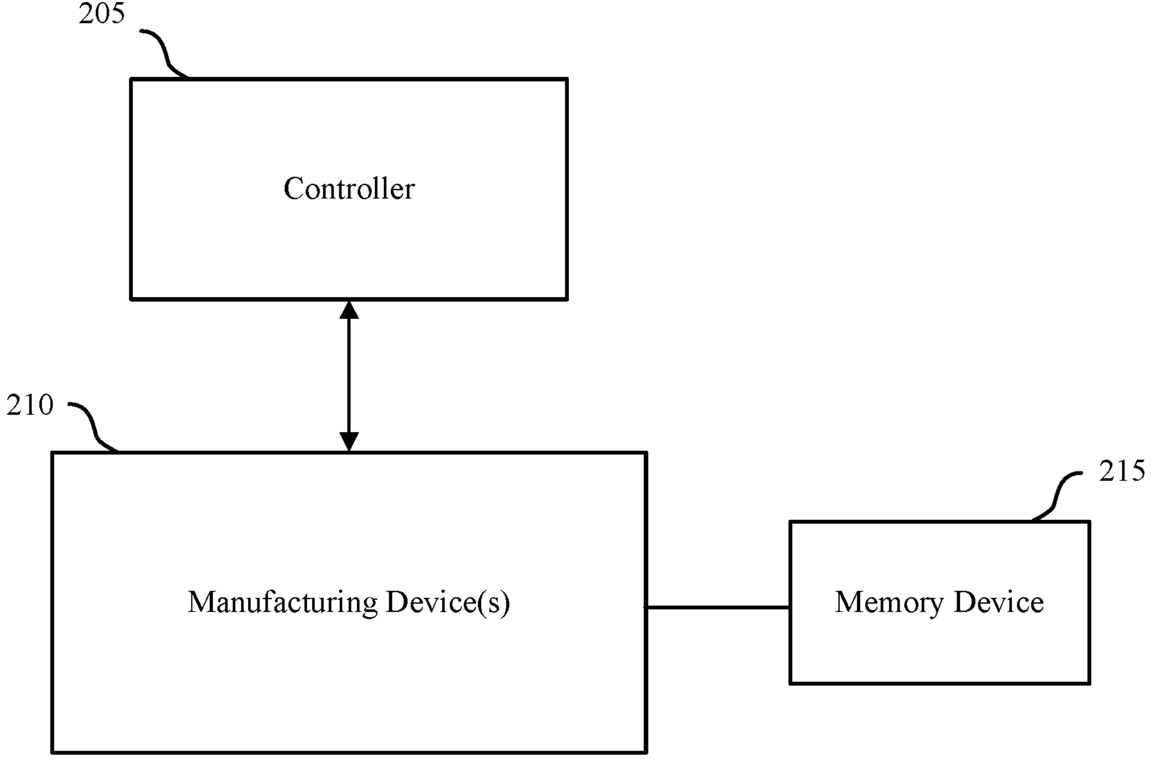
FIG. 2 illustrates an example of a manufacturing system that supports erosion rate monitoring for wafer fabrication equipment in accordance with examples as disclosed herein.

FIG. 2 illustrates an example of a manufacturing system 200 that supports erosion rate monitoring for wafer fabrication equipment in accordance with examples as disclosed herein. The manufacturing system 200 may fabricate one or more aspects of a semiconductor wafer that includes one or more transistors and/or other circuitry, such as the memory die 100 described with reference to FIG. 1. The manufacturing system 200 may include a controller 205 which may communicate with one or more manufacturing devices 210. The controller 205 may, for example, represent a manufacturing system controller or a controller for the manufacturing device(s) 210 (e.g., included in the manufacturing device (s) 210). Based on the communications between the controller 205 and the manufacturing device(s) 210, the manufacturing device(s) 210 may perform one or more fabrication techniques on a semiconductor wafer (e.g., memory device 215, which may be an example of a memory device described with reference to FIG. 1).

For example, the controller 205 may input information (e.g., manufacturing instructions or commands, fabrication processes) to the manufacturing device 210 via a connection (e.g., wired, wireless), and the manufacturing device 210 may transmit feedback information (e.g., an indication that an operation is complete) to the controller 205 via the same connection or another connection. In a further example, the manufacturing device 210 may perform one or more fabrication techniques (e.g., material depositing, material removal) on a memory device 215.

The manufacturing device 210 may perform various manufacturing operations on the memory device 215 during fabrication, based on communications with the controller 205. For example, the manufacturing device 210 may add (e.g., deposit) or remove (e.g., etch) various materials onto or from the memory device (e.g., onto the substrate, other materials, a portion of one or the other, or a combination of both). In some examples, the manufacturing device 210 may include a ring (e.g., an edge ring) which may be used to support the substrate of a memory device. In such examples, this edge ring may secure the memory device 215 during manufacturing operations and may enable consistent fabrication across the face of the memory device 215 (e.g., by protecting the edges of the memory device 215 from erosion due to ion sheath bending). In some examples, the controller 205, a controller within the manufacturing device 210, or a combination of both may reposition (e.g., vertically move) the edge ring for respective fabrication operations. In such examples, the controller 205 may command (e.g., instruct, indicate an operation to perform) a controller within the manufacturing device 210 to position the edge ring so the surface of the edge ring may be flush with the surface of the memory device 215 substrate.

In accordance with examples disclosed herein, the manufacturing system 200 may support a real-time edge ring erosion rate measurement technology. For example, a substrate support system may include a substrate support, a ring (e.g., an edge ring), and a ring support structure, where the ring support structure may be equipped with one or more sensors to measure various attributes of the ring (e.g., force, load). The sensor(s), for example, may measure the weight of the ring, which may be converted into a ring height by a controller (e.g., a controller 205 or another controller) and utilized to set an offset for a position of the ring. For example, the controller may determine whether to vertically reposition the ring relative to the substrate and corresponding substrate support, based on the calculated offset and a desired position for the ring. The controller may reposition the ring via actuators and associated pins in order to position the ring at a desired height (relative to the substrate) for one or more fabrication operations. This technology may be utilized to correct ion sheath bending and/or other problems associated with ring mass loss.

Figure 3A:
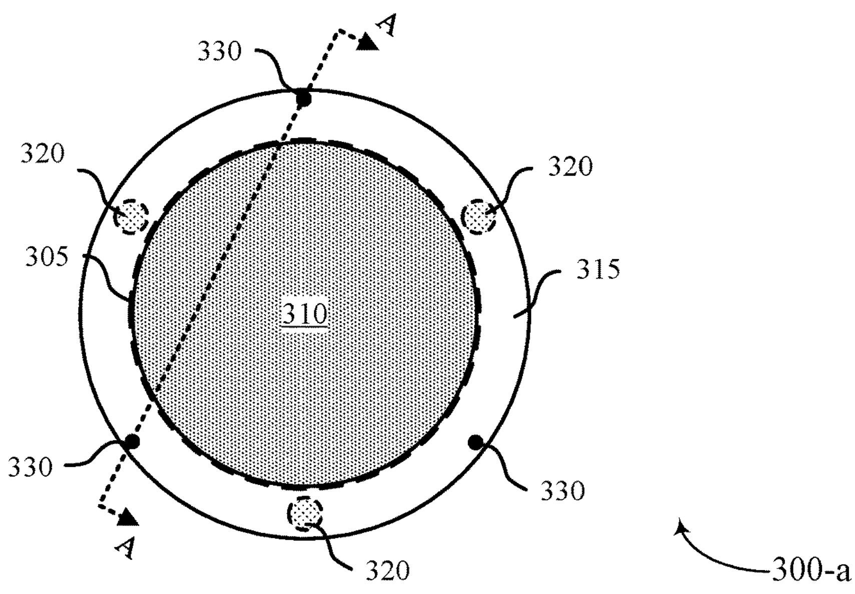
FIGS. 3A, 3B, and 3C illustrate examples of manufacturing systems that support erosion rate monitoring for wafer fabrication equipment in accordance with examples as disclosed herein.
Figure 3B:
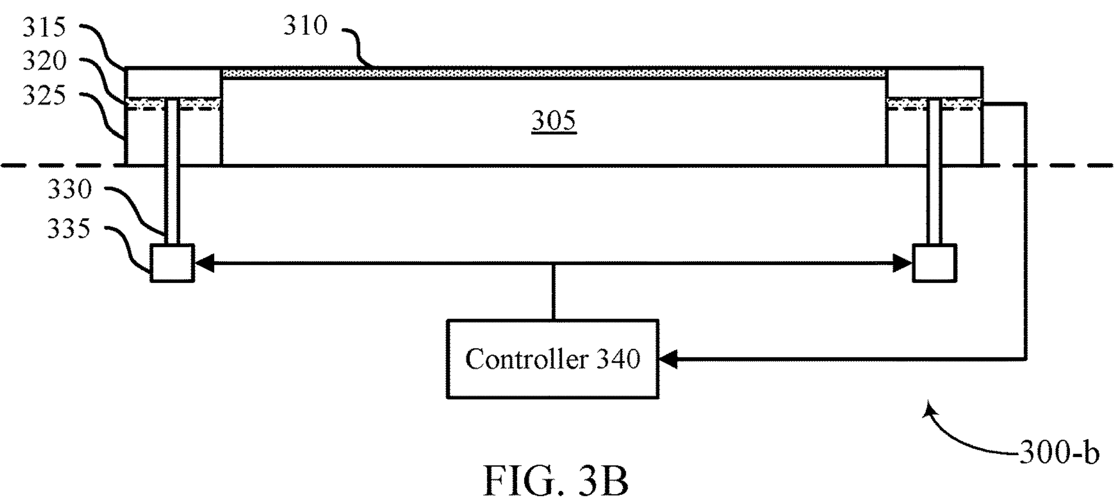
Figure 3C:
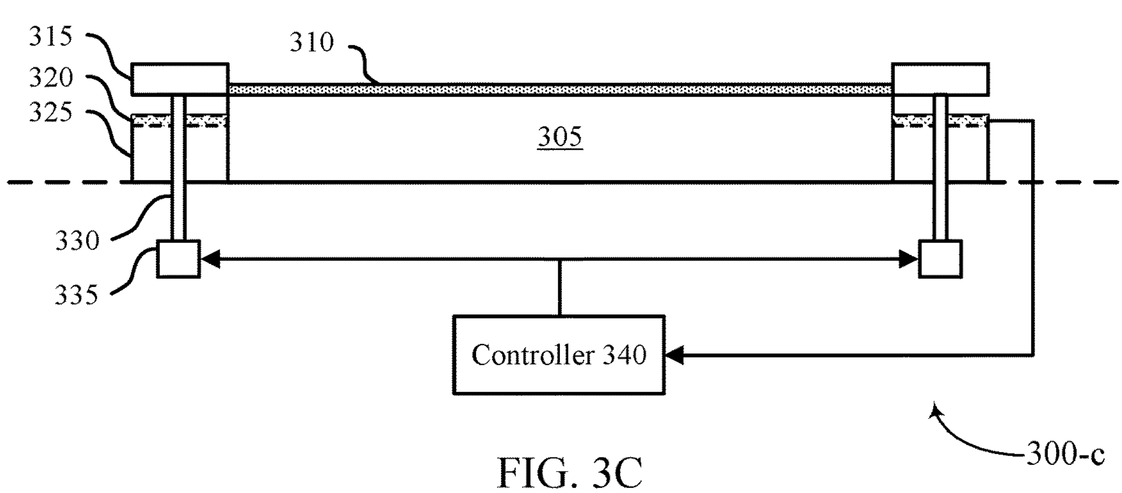

FIGS. 3A, 3B, and 3C illustrate examples of manufacturing systems 300-*a*, 300-*b*, and 300-*c* that support erosion rate monitoring for wafer fabrication equipment in accordance with examples as disclosed herein. The manufacturing system 300-*a* illustrates a top planar view, the manufacturing system 300-*b* illustrates a cross sectional view, and the manufacturing system 300-*c* illustrates a cross sectional view of a same manufacturing system 300. The cross-sectional views represent a view taken along the A-A line of the top planar view. The manufacturing system 300 may be used for fabrication of one or more aspects of a semiconductor wafer, and may implement or be implemented by aspects of the manufacturing system 200 as described with reference to FIG. 2. For example, the manufacturing system 300 may be used for fabrication of one or more aspects of the memory die 100, or another memory device, as described with reference to FIG. 1. Additionally or alternatively, the manufacturing system 300 may be used for fabrication of one or more aspects of another type of semiconductor wafer.

The manufacturing system 300 may include a controller 340, a substrate 310, an associated support 305 for the substrate 310 (e.g. an electrostatic chuck (ESC)), an edge ring 315, and a related support 325 for the edge ring 315 (e.g., a support structure, a structure for resting the edge ring 315 when the edge ring 315 is at a home or resting position). The edge ring 315 may be positioned radially around the substrate 310 and adjacent to the substrate 310 (e.g., may surround the substrate). In some examples, the controller 340 may be an example of a controller of a manufacturing device 210 described with reference to FIG. 2, a controller 205 described with reference to FIG. 2, or both. In some examples, the substrate 310 may be an example of a substrate of a memory die 100 or a memory device 215, as described with reference to FIGS. 1 and 2, respectively. In some examples, the substrate 310 may be an example of a substrate of a semiconductor wafer to be used for one or more other semiconductor devices or circuits.

In some memory device manufacturing, an etching process (e.g., a dry etching process, a plasma etching process) may be performed on the substrate 310 of a wafer (e.g., memory device wafer), or on one or more materials deposited above the substrate 310. For example, the etching process may be performed via the use of plasma to initiate an interaction of a process gas and an electric field inside a chamber, where in some cases, the edge ring 315 may be utilized to adjust an effect of the plasma on the substrate 310. The edge ring 315 may erode or otherwise change shape over time based on the various manufacturing processes (e.g., etching processes) performed on the substrate 310, which may result in the manufacturing system 300 non-optimally (e.g., incorrectly) positioning the edge ring 315 (e.g., in a vertical direction) for a given operation. For example, for a given operation the edge ring 315 may be positioned at a location X (e.g., in the vertical direction, based on the operation), but because of erosion the edge ring 315 may effectively be positioned at a location of X+an offset.

An ion sheath may be positioned over the substrate 310, and the edge ring 315 may be used to hold the ion sheath (e.g., hold the ion sheath in position). In some cases, the ion sheath may be bent near the outer edge of the substrate 310 (e.g., by a boundary with the edge ring 315) because of the erosion of the edge ring 315 (e.g., and resulting non-optimal placement of the edge ring 315). This sheath bending may negatively affect or erode at least an outer portion of the substrate 310 (e.g., and/or other memory device materials above the substrate 310) over time. Because of the sheath bending, some of the semiconductor wafer (or substrate thereof) may be deformed (e.g., tilted or slanted at an angle, rendered inoperable, or eventually rendered inoperable) during manufacturing, which may reduce a yield of the manufacturing process (e.g., in terms of memory cell yield, memory cell density, such as for a memory device).

In some cases, erosion monitoring technologies for the edge ring 315 may use exsitu tilt or slant measurement methods in an attempt to calculate current and future edge ring loss rate, such as by correlating ring height to time or to the quantity of operations performed. Such techniques, however, may result in inaccurate calculations of erosion because edge ring erosion may occur in a non-linear fashion, and may additionally or alternatively occur at different rates for different manufacturing processes. Erosion monitoring techniques such as interferometric sensors, line of sight techniques, or other exsitu methodologies may also result in inaccurate calculations, or may be unable to be implemented, because of space constraints within a manufacturing chamber housing the manufacturing system 300 or potential contamination.

According to the techniques described herein, a real-time edge ring erosion rate may be determined to correct ion sheath bending and/or other problems associated with edge ring mass loss. The manufacturing system 300 may support a real-time edge ring erosion rate determination using force sensors 320 (e.g., piezoelectric sensors, load cells, other sensors) under the edge ring 315, which may measure various force changes (e.g., force, pressure, weight) related to the mass of the edge ring 315 during a full or partial process time (e.g., mean time between clean (MTBC)). The force(s) measured by the force sensors 320 may be indicative of a weight of the edge ring 315 and therefore a mass of the edge ring 315. The controller 340 may correlate the measured force changes to an edge ring 315 mass consumption (e.g., mass change, mass reduction), and which may be indicative of a height of the edge ring 315. The controller 340 may use this calculated height to adjust (e.g., tune) the vertical placement of the edge ring 315 during operation (e.g., may set the edge ring 315 at an offset), which may compensate for edge ring erosion and provide correct positioning for ion sheath placement relative to the substrate 310 (e.g., thus reducing or eliminating yield loss for the associated memory device).

As depicted in the top planar view of the manufacturing system 300-*a*, the edge ring 315 may be positioned circumferentially (e.g., radially) around the substrate 310 and the substrate support 305 (e.g., adjacent to the substrate 310 and substrate support 305). Correspondingly, the edge ring supports 325 may be located beneath the edge ring 315 and may fully or partially surround (e.g., be radially adjacent to) the substrate support 305. Similarly, the substrate support 305 may be located beneath the substrate 310 and may be fully or partially encompassed by the edge ring 315 and the associated edge ring support 325. The controller 340 may vertically move the edge ring 315 (e.g., independent of the substrate 310, the substrate support 305, and the edge ring support 325) as shown in the cross-section view of the manufacturing system 300-*c*. For example, the controller 340 may control actuators 335, which may move pins 330 (e.g., rods, pillars, pins) coupled with the edge ring 315 in a vertical direction to position the edge ring 315. As described herein an actuator 335 may represent a component used to physically move another component (e.g., move via a motor, via other positioning mechanisms).

The edge ring 315 and substrate support 305 may be utilized for protecting and supporting the substrate 310. For example, the substrate support 305 may offer the manufacturing device a surface (e.g., flat, smooth, supported surface) to implement various processes (e.g., operations, methods) on, with, or in the surface of the substrate 310 of the memory device. Additionally, the edge ring 315 may protect the perimeter (e.g., edge) of the substrate 310 by preventing ion sheath bending. As such, the controller 340 may move the edge ring 315 vertically to keep the edge ring 315 at a vertical level (e.g., optimal vertical level) relative to the substrate 310, that may maintain consistent performance for a manufacturing operation being performed on the substrate 310.

Additionally, the manufacturing system 300 may include one or more (e.g., one, two, three, four, five, or more) sensors 320. For example, the sensors 320 may be located beneath the edge ring 315 (e.g., coupled with the edge ring support 325) and may be equally (e.g., uniformly) spaced from each other in a circumferential direction (e.g., may be positioned equidistant around the edge ring support 325), as depicted in manufacturing system 300-*a*. While three sensors 320 are described herein and illustrated by FIGS. 3A-3C, any number of sensors may be implemented using the techniques described herein. For example, similar techniques may be implemented using one sensor, two sensors, four sensors, or more.

As described herein, each of the actuators 335 may be associated with a pin 330, and each combination of such may also be spaced uniformly around the edge ring 315 and edge ring support 325. The sensors 320 may be attached or coupled to the edge ring support 325 (e.g., may be positioned between the edge ring support 325 and the edge ring 315). The sensors 320 may be independent of and near (e.g., lie adjacent to) the substrate support 305, and may remain as such during the raising and lowering of the edge ring 315 (as shown in cross-section views of manufacturing systems 300-*b* and 300-*c*). The controller 340 may utilize the actuators 335 and connected pins 330 to vertically move the edge ring 315 from the lowered (e.g., home) position depicted in cross-section view of manufacturing system 300-*b* to the raised position depicted in cross-section view of manufacturing system 300-*c*, and vice versa.

The sensors 320 may be utilized to measure the weight of the edge ring 315 (e.g., when the edge ring 315 is at the lowered or home position), which may be correlated to (e.g., by the controller 340) a corresponding height of the edge ring 315 (e.g., for use in repositioning the edge ring 315). For example, the sensors 320 may be configured to measure the force exerted by the weight of the edge ring 315. The sensors 320 may be examples of force sensors, piezoelectric sensors, load cell sensors, or other sensors compatible for such force sensing. The controller 340 may calculate or determine the height of the edge ring 315 and a corresponding offset for an operating position of the edge ring 315 (e.g., a position that may maintain consistent performance) relative to the substrate 310. The controller 340 may raise or lower the edge ring 315 via the actuators 335 and the associated pins 330 according to the calculated offset. This process of measurement, calculation, and adjustment may occur less than, equal to, or more than one time per manufacturing process (e.g., and may occur at different times or frequencies for different processes).

Although adjusting the position of the edge ring 315 in response to edge ring erosion is described herein, one or more other techniques may be used to compensate for the ion sheath bending that may be caused by erosion of the edge ring 315. Other examples associated with edge ring erosion measurement and compensation, such as voltage adjustment, may be appreciated by one of skill in the art.

By using weight measurements of the edge ring 315 to determine an edge ring erosion rate, manufacturing system 300 may perform real-time monitoring of edge ring erosion, which may result in real-time compensation for the erosion and increased ion sheath bending control (e.g., leading to higher yields, or lower yield loss). Further, in the case of using three or more sensors 320, weight measurements of the edge ring 315 may also indicate a deformation of the edge ring 315, an asymmetric erosion of the edge ring 315 (e.g., in a vertical direction), a placement or misplacement of the edge ring 315 (e.g., in a horizontal or planar direction, rotation in a circumferential direction), or other movements of the edge ring 315, which may respectively be compensated for in the respective manufacturing processes (e.g., by adjustment of one or more manufacturing parameters, such as edge ring placement or orientation, by replacing the edge ring 315).

Figure 4:
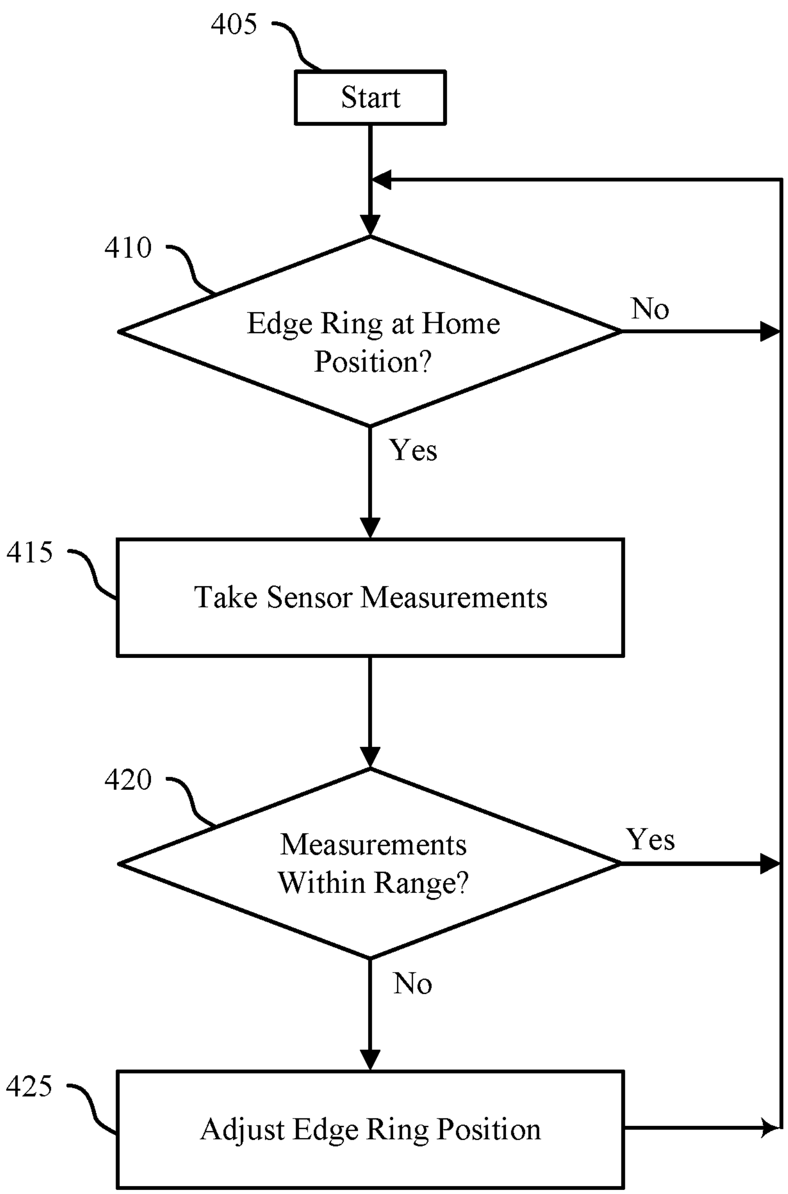
FIG. 4 illustrates an example of a flowchart that supports erosion rate monitoring for wafer fabrication equipment in accordance with examples as disclosed herein.

FIG. 4 illustrates an example of a flowchart 400 that supports erosion rate monitoring for wafer fabrication equipment in accordance with examples as disclosed herein. The operations of flowchart 400 may be implemented by a manufacturing system or one or more controllers associated with a manufacturing system as described herein. In some examples, one or more controllers may execute a set of instructions to control one or more functional elements of the manufacturing system to perform the described functions. Additionally or alternatively, one or more controllers may perform aspects of the described functions using special-purpose hardware.

At 405, the system may begin real-time erosion rate monitoring and compensation which may restart at a beginning of one or more processing operations (e.g., plasma processing operations). For example, the monitoring may restart for each processing operation, after a time period, after a quantity of processing operations are performed, or at a defined frequency, among other examples. The techniques for real-time erosion rate monitoring and compensation (starting with 405) may be examples of erosion rate monitoring and compensation for an edge ring as described with reference to FIGS. 3A-3C.

At 410, the system may determine that the edge ring is at a home (e.g., lowered) position relative to the substrate support structure and/or ring support structure (depicted and described with reference to FIGS. 3A-3C). For example, if a controller determines that the edge ring is at the home position, the controller may determine that a sensor measurement may be taken. In this case, the system may proceed to 415.

In another example, if the controller determines that the edge ring may not be at the home position (e.g., may be raised for a manufacturing process), the controller may refrain from taking a sensor measurement and may wait for the edge ring to be at the home position (e.g., wait until the current process or step is complete, wait until the current or overall process is complete). In this case, the system may return to 410 and the controller may once again determine if the edge ring is at the home position or not (e.g., after a passage of time, upon determining that a process is complete). The edge ring may return to the home position relatively frequently throughout various processes (e.g., between processes or steps, as part of processes or steps), and thus the returning of the edge ring to the home position (e.g., edge ring reset) may not add additional time to the overall processing time (e.g., may already be performed as part of normal function of the manufacturing system).

At 415, the system may use one or more sensors (e.g., such as the sensors described with reference to FIGS. 3A-3C) to measure a weight associated with the edge ring while the edge ring is at the home position. For example, the one or more sensors may generate a signal (e.g., an electric signal) indicative of the weight associated with the edge ring. Because the edge ring may return to the home position relatively frequently, the measurements performed at 410 may occur each time the ring is at the home position, may happen at a defined time interval, at a defined frequency, or after performing a quantity of processes or operations, among other examples (e.g., based on a rate of erosion).

At 420, the system may determine whether the measurements by the sensors may be within a range (e.g., a defined range). For example, a controller may compare the measurements taken by the sensors to a range of acceptable edge ring weight measurements or may correlate the weight measurements to a height of the edge ring and may compare the height to a range of acceptable edge ring height measurements. The range of acceptable measurements may include a margin for error and may thus correlate measured edge ring attributes (e.g., weight, height) to a one or more levels of erosion, while providing a margin for error. For example, the controller may compare a sensor measurement to the range and determine the measurement to be within the acceptable range (e.g., of weight, height). In this case, no adjustments to the vertical positioning of the edge ring (e.g., or other manufacturing variable) may be made because the edge ring may not have eroded past an acceptable amount of erosion (e.g., an offset position for the edge ring may be equal to zero). Thus, the edge ring may already be in an acceptable position, or other manufacturing parameters may be acceptable, based on the relatively small amount of erosion, and the manufacturing process may continue (e.g., and the system may return to 410).

In another example, the controller may compare a sensor measurement to the range and determine the measurement to outside of the acceptable range (e.g., of weight, height) due to erosion of the edge ring. As such, to decrease a likelihood of the process operations reducing yield, the edge ring may be vertically repositioned, or another manufacturing variable may be adjusted. For example, the controller may set an offset (e.g., a height change, a nonzero offset) for the vertical position of the edge ring at 420 according to a based on a correlation between the sensor measurements and the height of the edge ring. Such a correlation may be previously determined and stored at a controller or device implementing the techniques of the flowchart 400, and may, for example, be based on one or more previously performed tests, experiments, or other forms of data gathering (e.g., among other examples).

At 425, the system may adjust the vertical positioning of the edge ring according to an offset. For example, the controller may utilize actuators and associated pins which may be in contact with the edge ring to vertically reposition the edge ring according to a correlation (e.g., previously determined correlation, stored correlation) between a measured attribute (e.g., weight) of the edge ring and a corresponding set of vertical dimensions associated with the edge ring (e.g., a height or position of the edge ring, or both). The manufacturing process using the substrate and edge ring may continue and, after performing the operations of 425, the system may return to 410.

Figure 5:
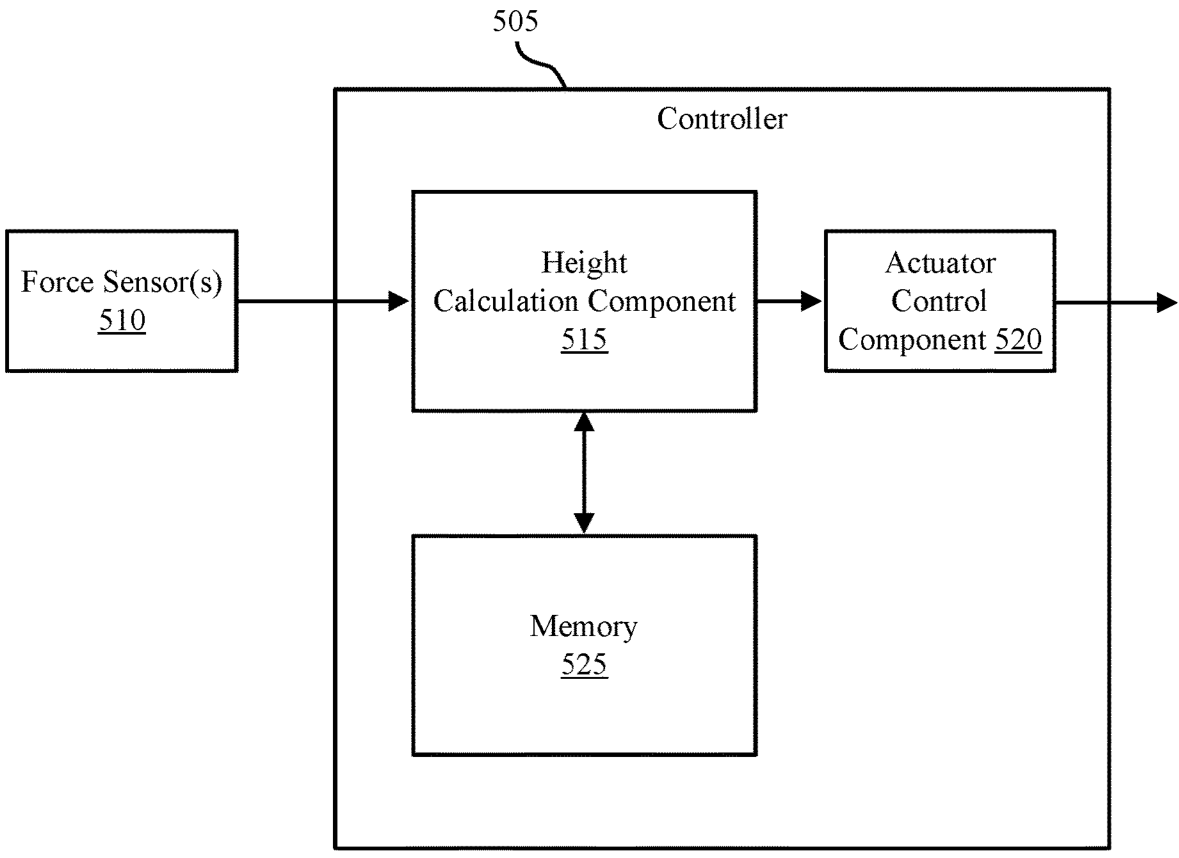
FIG. 5 illustrates an example of a system that supports erosion rate monitoring for wafer fabrication equipment in accordance with examples as disclosed herein.

FIG. 5 illustrates an example of a system 500 that supports erosion rate monitoring for wafer fabrication equipment in accordance with examples as disclosed herein. The system 500 may implement or be implemented by aspects of the manufacturing system 200, manufacturing system 300, and flowchart as described with reference to FIGs. FIG. 2-4. The system 500 may also be used to manufacture a memory die 100 (e.g., at least a portion of a memory device) as described with reference to FIG. 1.

The system 500 may include a controller 505 which may be an example of the controller 340 as described with reference to FIGS. 3A-3C and/or a controller 205 described with reference to FIG. 2. The controller 505 may include a height calculation component 515, an actuator control component 520, and a memory 525, and may receive information from one or more force sensors 510, where the force sensor(s) may be examples of the sensors described with reference to FIGS. 3A-4. For example, the controller 505 may receive information (e.g., a signal, voltage, indication of a force) from a force sensor 510 via a connection (e.g., wired connection). The height calculation component 515 of the controller 505 may perform one or more actions (e.g., height calculations or correlation) based on the information from the force sensor 510, on information received from the memory 525 (e.g., a table or other correlation between ring weight and height, ring weight and position, or both), or a combination of both.

The height calculation component may communicate a result of the height calculations with the memory 525, the actuator control component 520, or a combination of the two. The actuator control component 520 may perform one or more actions (e.g., power on actuators, power off actuators) based on the information (e.g., instructions) sent by the height calculation component 515.

The one or more force sensors 510 may transmit, to the height calculation component 515, information (e.g., the weight) corresponding to the edge ring. For example, one or more sensors 510 associated with the edge ring may measure the weight of the edge ring (e.g., the force exerted onto the sensor(s) 510 by the edge ring), generate a signal indicative of the weight of the edge ring, and transmit this signal to the controller 505 (e.g., the height calculation component 515 of the controller 505). As such, the controller 505 may receive the signal from the force sensors 510 and may be made aware of the weight of the edge ring (e.g., the weight of the ring at the time the measurement was taken by the sensor 510).

The height calculation component 515 of the controller 505 may utilize the weight of the edge ring to determine a dimension of the edge ring in the vertical direction (e.g., the height of the edge ring). For example, the height calculation component 515 may utilize the weight in calculations to solve for the height of the edge ring. In other examples, the height calculation component 515 may determine the height of the ring by comparing the weight to a set of multiple weights in a look-up table or other data structure (e.g., stored in the memory 525 of the controller 505). In this case, the table or data structure may indicate a correlation (e.g., a previously determined correlation, stored correlation) between multiple edge ring weights and multiple edge ring heights, such that the controller may use the weight to determine a height of the edge ring.

The height calculation component 515 of the controller 505 may also determine an offset for a position of the edge ring (e.g., in the vertical direction). For example, the height calculation component may correlate the determined height of the edge ring, or the weight of the edge ring, to a desired offset and transmit an indication of this offset to the actuator control component 520. Additionally or alternatively, the actuator control component 520 may determine the desired offset based on the height or the weight of the edge ring.

In one example, the height calculation component 515 (e.g., or the actuator control component 520) may determine a change in the height of the edge ring due to erosion over time by comparing the determined height of the edge ring to a previously determined height (e.g., the original height of the edge ring, the height of the overall system) and may use this change in height as an offset by which to adjust the vertical position of the edge ring. In another example, the height calculation component 515 (e.g., or the actuator control component 520) may determine the offset by consulting one or more tables or data structures (e.g., stored in the memory 525), to correlate the determined height or weight of the edge ring to a pre-determined offset. For example, the height calculation component 515 (e.g., or the actuator control component 520) may determine the height of the ring by comparing the height or weight of the ring to a set of multiple heights or multiple weights in a look-up table or other data structure (e.g., stored in the memory 525 of the controller 505). In this case, the table or data structure may indicate a correlation (e.g., a previously determined correlation, stored correlation) between multiple edge ring weights or heights and multiple edge ring offset positions, such that the controller may use the height or weight to determine an offset position for the edge ring If the height calculation component 515 determines the edge ring offset, the height calculation component 515 may transmit this offset to the actuator control component 520, which component may use the offset to set the vertical position of the ring accordingly (e.g., set the ring to the offset position, to a desired position plus the offset). If the actuator control component 520 determines the edge ring offset, the actuator control component 520 may use the determined offset to set the vertical position of the ring accordingly (e.g., set the ring to the offset position, to a desired position plus the offset). In either case, the actuator control component 520 may control one or more actuators (e.g., each including an actuator and an associated pin) to move the edge ring to the desired position, or offset. For example, the actuator control component 520 may signal the one or more actuators, which may result in the one or more actuators moving the edge ring to the desired position, or offset.

In some cases, as described with reference to FIG. 4, there may be no offset for the vertical position of the edge ring, or the offset may be determined to be zero (e.g., if the weight or height of the ring falls within a range of values, such as values for a margin for error).

In some cases, the controller 505 may also pass (e.g., transmit, communicate) some or all of the described information (e.g., edge ring weight, height, offset) to a device outside of the manufacturing system or the controller 505, or both. For example, the controller 505 may transmit calculated or measured edge ring data (e.g., height, weight, process time, lifetime expectancies) to a location (e.g., long-term storage, short-term storage, a data collector, a data analyzer) outside of the manufacturing system to be utilized in further optimization of edge ring erosion monitoring and compensation techniques. The data (e.g., measured data, calculated data, transmitted data) may also be related to asymmetric erosion, deformation, position and other aspects of edge ring usage and operation, as described with reference to FIGS. 3A-3C.

Figure 6:
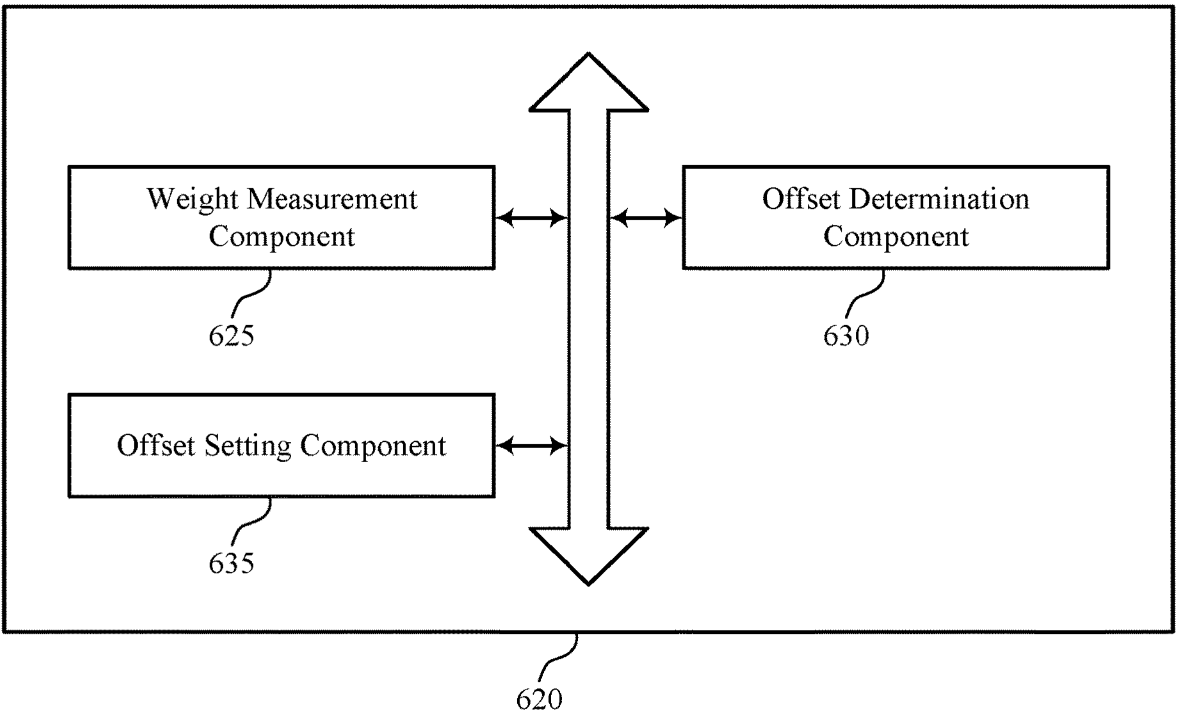
FIG. 6 shows a block diagram of a manufacturing system that supports erosion rate monitoring for wafer fabrication equipment in accordance with examples as disclosed herein.

FIG. 6 shows a block diagram 600 of a manufacturing system 620 that supports erosion rate monitoring for wafer fabrication equipment in accordance with examples as disclosed herein. The manufacturing system 620 may be an example of aspects of a manufacturing system as described with reference to FIGS. 1 through 5. The manufacturing system 620, or various components thereof, may be an example of means for performing various aspects of erosion rate monitoring for wafer fabrication equipment as described herein. For example, the manufacturing system 620 may include a weight measurement component 625, an offset determination component 630, an offset setting component 635, or any combination thereof. Each of these components may communicate, directly or indirectly, with one another (e.g., via one or more buses).

The weight measurement component 625 may be configured as or otherwise support a means for measuring, using one or more sensors coupled with a support structure for a ring, a weight associated with the ring, the ring for one or more fabrication processes performed on a device and having a central axis oriented in a vertical direction, where the ring is coupled with one or more actuators for moving the ring in the vertical direction. The offset determination component 630 may be configured as or otherwise support a means for determining, at a controller coupled with the one or more sensors and the one or more actuators, an offset for a position of the ring in the vertical direction based at least in part on the weight. The offset setting component 635 may be configured as or otherwise support a means for setting, by the one or more actuators, the offset for the position of the ring in the vertical direction based at least in part on determining the offset.

In some examples, the offset determination component 630 may be configured as or otherwise support a means for determining that the weight is within a range of measurements. In some examples, the offset determination component 630 may be configured as or otherwise support a means for determining the offset for the position of the ring to be zero based at least in part on determining that the weight is within the range.

In some examples, the offset determination component 630 may be configured as or otherwise support a means for determining that the weight is outside of a range of measurements. In some examples, the offset determination component 630 may be configured as or otherwise support a means for determining the offset for the position of the ring to be nonzero based at least in part on determining that the weight is outside of the range.

In some examples, the weight measurement component 625 may be configured as or otherwise support a means for determining that the ring is at a home position relative to the support structure, where measuring the weight is based at least in part on determining that the ring is at the home position.

Figure 7:
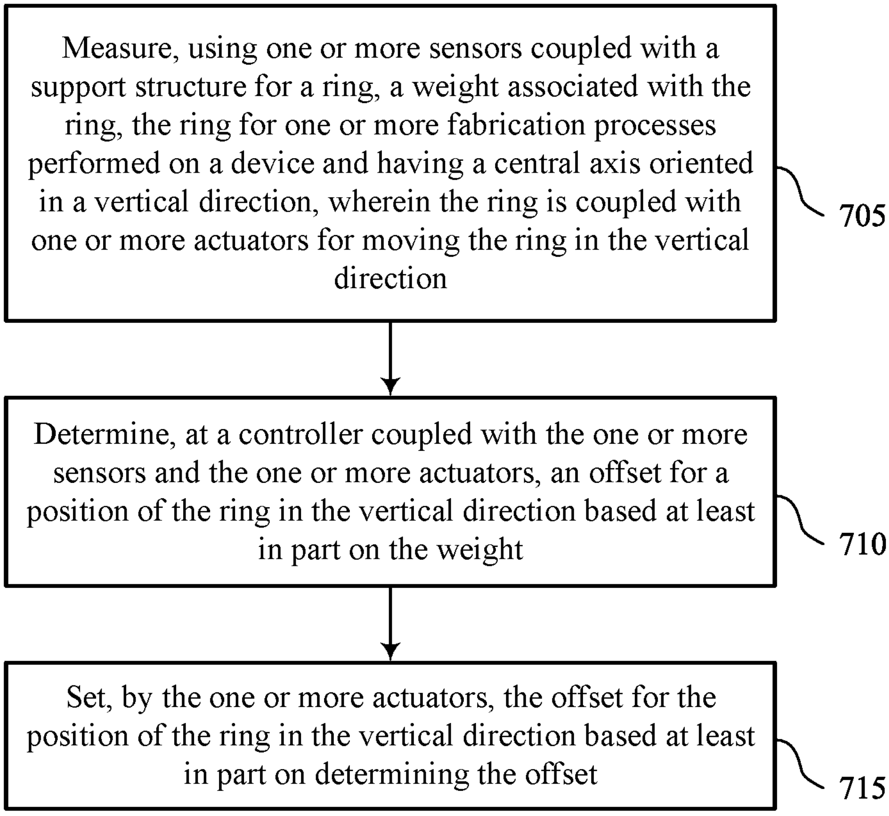
FIG. 7 shows a flowchart illustrating a method or methods that support erosion rate monitoring for wafer fabrication equipment in accordance with examples as disclosed herein.

FIG. 7 shows a flowchart illustrating a method 700 that supports erosion rate monitoring for wafer fabrication equipment in accordance with examples as disclosed herein. The operations of method 700 may be implemented by a manufacturing system or its components as described herein. For example, the operations of method 700 may be performed by a manufacturing system as described with reference to FIGS. 1 through 6. In some examples, a manufacturing system may execute a set of instructions to control the functional elements of the device to perform the described functions. Additionally, or alternatively, the manufacturing system may perform aspects of the described functions using special-purpose hardware.

At 705, the method may include measuring, using one or more sensors coupled with a support structure for a ring, a weight associated with the ring, the ring for one or more fabrication processes performed on a device and having a central axis oriented in a vertical direction, where the ring is coupled with one or more actuators for moving the ring in the vertical direction. The operations of 705 may be performed in accordance with examples as disclosed herein. In some examples, aspects of the operations of 705 may be performed by a weight measurement component 625 as described with reference to FIG. 6.

At 710, the method may include determining, at a controller coupled with the one or more sensors and the one or more actuators, an offset for a position of the ring in the vertical direction based at least in part on the weight. The operations of 710 may be performed in accordance with examples as disclosed herein. In some examples, aspects of the operations of 710 may be performed by an offset determination component 630 as described with reference to FIG. 6.

At 715, the method may include setting, by the one or more actuators, the offset for the position of the ring in the vertical direction based at least in part on determining the offset. The operations of 715 may be performed in accordance with examples as disclosed herein. In some examples, aspects of the operations of 715 may be performed by an offset setting component 635 as described with reference to FIG. 6.

In some examples, an apparatus as described herein may perform a method or methods, such as the method 700. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for measuring, using one or more sensors coupled with a support structure for a ring, a weight associated with the ring, the ring for one or more fabrication processes performed on a device and having a central axis oriented in a vertical direction, where the ring is coupled with one or more actuators for moving the ring in the vertical direction; determining, at a controller coupled with the one or more sensors and the one or more actuators, an offset for a position of the ring in the vertical direction based at least in part on the weight; and setting, by the one or more actuators, the offset for the position of the ring in the vertical direction based at least in part on determining the offset.

Aspect 2: The method, apparatus, or non-transitory computer-readable medium of aspect 1, further including operations, features, circuitry, logic, means, or instructions, or any combination thereof for determining that the weight is within a range of measurements and determining the offset for the position of the ring to be zero based at least in part on determining that the weight is within the range.

Aspect 3: The method, apparatus, or non-transitory computer-readable medium of any of aspects 1 through 2, further including operations, features, circuitry, logic, means, or instructions, or any combination thereof for determining that the weight is outside of a range of measurements and determining the offset for the position of the ring to be nonzero based at least in part on determining that the weight is outside of the range.

Aspect 4: The method, apparatus, or non-transitory computer-readable medium of any of aspects 1 through 3, further including operations, features, circuitry, logic, means, or instructions, or any combination thereof for determining that the ring is at a home position relative to the support structure, where measuring the weight is based at least in part on determining that the ring is at the home position.

It should be noted that the methods described herein describe possible implementations, and that the operations and the steps may be rearranged or otherwise modified and that other implementations are possible. Further, portions from two or more of the methods may be combined.

A system is described. The following provides an overview of aspects of the system as described herein:

Aspect 5: A system, including: a substrate for supporting a memory device; a ring positioned around the substrate and configured for one or more fabrication processes performed on the memory device, the ring having a central axis oriented in a vertical direction; a support structure positioned below the ring for supporting the ring as part of the one or more fabrication processes; one or more actuators coupled with the ring and configured to move the ring in the vertical direction; one or more sensors coupled with the support structure and configured to generate a signal indicative of a weight associated with the ring; and a controller coupled with the one or more actuators and the one or more sensors, the controller configured to identify an offset for a position of the ring in the vertical direction based at least in part on the weight associated with the ring.

Aspect 6: The system of aspect 5, where the controller is further configured to determine a dimension of the ring in the vertical direction based at least in part on the weight, the offset for the position of the ring is based at least in part on the dimension of the ring in the vertical direction.

Aspect 7: The system of aspect 6, where the controller is configured to determine the dimension of the ring in the vertical direction based at least in part on a correlation between a plurality of weights associated with the ring and a corresponding plurality of dimensions associated with the ring in the vertical direction.

Aspect 8: The system of any of aspects 6 through 7, where the controller is configured to determine the offset for the position of the ring based at least in part on a correlation between the offset for the position of the ring and a corresponding plurality of weights associated with the ring, a corresponding plurality of dimensions of the ring in the vertical direction, or both.

Aspect 9: The system of any of aspects 6 through 8, where the controller is further configured to transmit an indication of the weight, the dimension of the ring, or both to a second device external to the system.

Aspect 10: The system of any of aspects 5 through 9, where the one or more sensors are configured to generate the signal indicative of the weight associated with the ring based at least in part on the ring being at a home position relative to the support structure.

Aspect 11: The system of any of aspects 5 through 10, where the one or more sensors are configured to generate the signal indicative of the weight based at least in part on a frequency for measuring the weight, a time period associated with measuring the weight, or both.

Aspect 12: The system of any of aspects 5 through 11, where the one or more sensors are positioned between the support structure and the ring.

Aspect 13: The system of any of aspects 5 through 12, where the one or more sensors include two or more sensors that are positioned equidistant around the support structure, the support structure having a circular shape.

Aspect 14: The system of any of aspects 5 through 13, where the weight associated with the ring is indicative of a position of the ring relative to the support structure in a horizontal direction, a deformation of the ring, an asymmetric erosion of a dimension of the ring, or any combination thereof Aspect 15: The system of any of aspects 5 through 14, where the one or more sensors include one or more sensors that measure a force applied by the ring to the one or more sensors.

Aspect 16: The system of any of aspects 5 through 15, where the one or more sensors include at least three sensors.

An apparatus is described. The following provides an overview of aspects of the apparatus as described herein:

Aspect 17: An apparatus, including: a ring configured for one or more fabrication processes performed on a device; a support structure positioned below the ring for supporting the ring as part of the one or more fabrication processes; and one or more sensors coupled with the support structure and configured to generate a signal indicative of a weight associated with the ring.

Aspect 18: The apparatus of aspect 17, further including: one or more actuators coupled with the ring and configured to move the ring in a vertical direction, the ring having a central axis oriented in the vertical direction; and a controller coupled with the one or more actuators and the one or more sensors, the controller configured to identify an offset for a position of the ring in the vertical direction based at least in part on the weight associated with the ring.

Aspect 19: The apparatus of aspect 18, where the controller is further configured to determine a dimension of the ring in the vertical direction based at least in part on the weight, the offset for the position of the ring is based at least in part on the dimension of the ring in the vertical direction.

Aspect 20: The apparatus of any of aspects 18 through 19, where the controller is further configured to determine a dimension of the ring in the vertical direction based at least in part on a correlation between a plurality of weights associated with the ring and a corresponding plurality of dimensions of the ring in the vertical direction.

Aspect 21: The apparatus of any of aspects 18 through 20, where the controller is further configured to determine the offset for the position of the ring based at least in part on a correlation between the offset for the position of the ring and a corresponding plurality of weights associated with the ring, a corresponding plurality of dimensions of the ring in the vertical direction, or both.

Aspect 22: The apparatus of any of aspects 18 through 21, where the controller is further configured to transmit an indication of the weight, a dimension of the ring, or both to a second device external to the apparatus.

Aspect 23: The apparatus of any of aspects 17 through 22, where the one or more sensors are configured to generate the signal indicative of the weight based at least in part on the ring being at a home position relative to the support structure.

Aspect 24: The apparatus of any of aspects 17 through 23, where the one or more sensors are positioned between the support structure and the ring.

Aspect 25: The apparatus of any of aspects 17 through 24, where the one or more sensors include two or more sensors that are positioned equidistant around the support structure, the support structure having a circular shape.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (e.g., in conductive contact with, connected with, coupled with) one another if there is any electrical path (e.g., conductive path) between the components that can, at any time, support the flow of signals (e.g., charge, current voltage) between the components. At any given time, a conductive path between components that are in electronic communication with each other (e.g., in conductive contact with, connected with, coupled with) may be an open circuit or a closed circuit based on the operation of the device that includes the connected components. A conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components (e.g., over a conductive path) to a closed-circuit relationship between components in which signals are capable of being communicated between components (e.g., over the conductive path). When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The terms "layer" and "level" used herein refer to an organization (e.g., a stratum, a sheet) of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, or materials. In some examples, one layer or level may be composed of two or more sublayers or sublevels.

As used herein, the term "electrode" may refer to an electrical conductor, and in some examples, may be employed as an electrical contact to a memory cell or other component of a memory array. An electrode may include a trace, a wire, a conductive line, a conductive layer, or the like that provides a conductive path between components of a memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component (e.g., a transistor) discussed herein may represent a field-effect transistor (FET), and may comprise a three-terminal component including a source (e.g., a source terminal), a drain (e.g., a drain terminal), and a gate (e.g., a gate terminal). The terminals may be connected to other electronic components through conductive materials (e.g., metals, alloys). The source and drain may be conductive, and may comprise a doped (e.g., heavily-doped, degenerate) semiconductor region. The source and drain may be separated by a doped (e.g., lightly-doped) semiconductor region or channel. If the channel is n-type (e.g., majority carriers are electrons), then the FET may be referred to as a n-type FET. If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions (e.g., code) on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a processor, such as a DSP, an ASIC, an FPGA, discrete gate logic, discrete transistor logic, discrete hardware components, other programmable logic device, or any combination thereof designed to perform the functions described herein. A processor may be an example of a microprocessor, a controller, a microcontroller, a state machine, or any type of processor. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a computer, or a processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A system, comprising:

a substrate for supporting a memory device;

a ring positioned around the substrate and configured for one or more fabrication processes performed on the memory device, the ring having a central axis oriented in a vertical direction;

a support structure positioned below the ring for supporting the ring as part of the one or more fabrication processes;

one or more actuators coupled with the ring and configured to move the ring in the vertical direction;

one or more sensors coupled with the support structure and configured to generate a signal indicative of a weight associated with the ring; and a controller coupled with the one or more actuators and the one or more sensors, the controller configured to calculate, based at least in part on determining that at least one of the one or more fabrication processes is complete and that the ring is at a home position relative to the support structure, a height dimension of the ring based at least in part on the signal indicative of the weight associated with the ring, wherein the controller is further configured to calculate an offset for a position of the ring in the vertical direction based at least in part on the calculated height dimension of the ring.

2. The system of claim 1, wherein the controller is further configured to determine a dimension of the ring in the vertical direction based at least in part on the weight.

3. The system of claim 2, wherein the controller is configured to determine the dimension of the ring in the vertical direction based at least in part on a correlation between a plurality of weights associated with the ring and a corresponding plurality of dimensions associated with the ring in the vertical direction.

4. The system of claim 2, wherein the controller is further configured to calculate the offset for the position of the ring based at least in part on a correlation between the offset for the position of the ring and a corresponding plurality of weights associated with the ring, a corresponding plurality of dimensions of the ring in the vertical direction, or both.

5. The system of claim 2, wherein the controller is further configured to transmit an indication of the weight, a dimension of the ring, the height dimension of the ring, or a combination thereof to a second device external to the system.

6. The system of claim 1, wherein the one or more sensors are configured to generate the signal indicative of the weight associated with the ring based at least in part on the ring being at the home position relative to the support structure.

7. The system of claim 1, wherein the one or more sensors are configured to generate the signal indicative of the weight based at least in part on a frequency for measuring the weight, a time period associated with measuring the weight, or both.

8. The system of claim 1, wherein the one or more sensors are positioned between the support structure and the ring.

9. The system of claim 1, wherein the one or more sensors comprise two or more sensors that are positioned equidistant around the support structure, the support structure having a circular shape.

10. The system of claim 1, wherein the weight associated with the ring is indicative of a position of the ring relative to the support structure in a horizontal direction, a deformation of the ring, an asymmetric erosion of a dimension of the ring, or any combination thereof.

11. The system of claim 1, wherein the one or more sensors comprise one or more sensors that measure a force applied by the ring to the one or more sensors.

12. The system of claim 1, wherein the one or more sensors comprise at least three sensors.

13. The system of claim 1, wherein the controller is further configured to calculate the height dimension of the ring based at least in part on a quantity of the one or more fabrication processes performed on the memory device.

14. An apparatus, comprising:

a ring configured for one or more fabrication processes performed on a device;

a support structure positioned below the ring for supporting the ring as part of the one or more fabrication processes;

one or more sensors coupled with the support structure and configured to generate a signal indicative of a weight associated with the ring;

one or more actuators coupled with the ring and configured to move the ring in a vertical direction, the ring having a central axis oriented in the vertical direction; and a controller coupled with the one or more sensors, the controller configured to calculate, based at least in part on determining that at least one of the one or more fabrication processes is complete and that the ring is at a home position relative to the support structure, a height dimension of the ring based at least in part on the signal indicative of the weight associated with the ring, and wherein the controller is further configured to calculate an offset for a position of the ring in the vertical direction based at least in part on the calculated height dimension of the ring.

15. The apparatus of claim 14, wherein the controller is further configured to determine a dimension of the ring in the vertical direction based at least in part on the weight.

16. The apparatus of claim 14, wherein the controller is further configured to determine a dimension of the ring in the vertical direction based at least in part on a correlation between a plurality of weights associated with the ring and a corresponding plurality of dimensions of the ring in the vertical direction.

17. The apparatus of claim 14, wherein the controller is further configured to calculate the offset for the position of the ring based at least in part on a correlation between the offset for the position of the ring and a corresponding plurality of weights associated with the ring, a corresponding plurality of dimensions of the ring in the vertical direction, or both.

18. The apparatus of claim 14, wherein the controller is further configured to transmit an indication of the weight, a dimension of the ring, the height dimension of the ring, or a combination thereof to a second device external to the apparatus.

19. The apparatus of claim 14, wherein the one or more sensors are configured to generate the signal indicative of the weight based at least in part on the ring being at the home position relative to the support structure.

20. The apparatus of claim 14, wherein the one or more sensors are positioned between the support structure and the ring.

21. The apparatus of claim 14, wherein the one or more sensors comprise two or more sensors that are positioned equidistant around the support structure, the support structure having a circular shape.

22. A method, comprising:

measuring, using one or more sensors coupled with a support structure for a ring, a weight associated with the ring based at least in part on a frequency for measuring the weight, the ring for one or more fabrication processes performed on a device and having a central axis oriented in a vertical direction, wherein the ring is coupled with one or more actuators for moving the ring in the vertical direction;

calculating, at a controller coupled with the one or more sensors and the one or more actuators and based at least in part on determining that at least one of the one or more fabrication processes is complete and that the ring is at a home position relative to the support structure, a height dimension of the ring based at least in part on a signal indicative of the weight associated with the ring;

calculating, at the controller coupled with the one or more sensors and the one or more actuators, an offset for a position of the ring in the vertical direction based at least in part on the calculated height dimension of the ring; and setting, by the one or more actuators, the offset for the position of the ring in the vertical direction based at least in part on determining the offset.

23. The method of claim 22, further comprising:

determining that the weight is within a range of measurements; and determining the offset for the position of the ring to be zero based at least in part on determining that the weight is within the range.

24. The method of claim 22, further comprising:

determining that the weight is outside of a range of measurements; and determining the offset for the position of the ring to be nonzero based at least in part on determining that the weight is outside of the range.

25. The method of claim 22, further comprising:

determining that the ring is at the home position relative to the support structure, wherein measuring the weight is based at least in part on determining that the ring is at the home position.

* * * * *